US010692206B2

(12) United States Patent
 Kodera

(10) Patent No.: US 10,692,206 B2
(45) Date of Patent: Jun. 23, 2020

(54) CRYSTAL ANALYSIS APPARATUS AND CRYSTAL ANALYSIS METHOD

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Masako Kodera, Kanazawa Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 33 days.

(21) Appl. No.: 15/905,326

(22) Filed: Feb. 26, 2018

(65) Prior Publication Data
 US 2019/0005635 A1    Jan. 3, 2019

(30) Foreign Application Priority Data
 Jun. 28, 2017   (JP) .................................. 2017-126112

(51) Int. Cl.
 *H01L 21/67* (2006.01)
 *G06T 7/00* (2017.01)
 (Continued)

(52) U.S. Cl.
 CPC ............... *G06T 7/001* (2013.01); *G06T 7/40* (2013.01); *H01L 21/67288* (2013.01);
 (Continued)

(58) Field of Classification Search
 CPC combination set(s) only.
 See application file for complete search history.

(56) References Cited

U.S. PATENT DOCUMENTS 9,564,494 B1 *   2/2017   Cheng ..................... H01L 29/32
 2006/0233434 A1 *  10/2006  Hamamatsu ......... G06K 9/2027
                                                          382/149
 (Continued)

FOREIGN PATENT DOCUMENTS

JP      2014033215 A      2/2014
 JP      2014153177 A      8/2014
                   (Continued)

OTHER PUBLICATIONS

Yukihito Kondo et al., Strain Analysis Using STEM Moire Method, Microscopy (Japanese), vol. 49, No. 3, 2014, pp. 226-230.
 (Continued)

*Primary Examiner* — Tsung Yin Tsai
(74) *Attorney, Agent, or Firm* — Kim & Stewart LLP

(57) ABSTRACT

A crystal analysis apparatus includes a first storage unit storing a crystal lattice image of a crystal region of a sample and a reference crystal lattice image for the crystal region of the sample. A first image processing unit is configured to generate a moiré image from the crystal lattice image and the reference crystal lattice image. A second storage unit stores a predetermined correspondence relationship between a moiré fringe pattern in the moiré image and a crystal defect in the crystal region or a predetermined correspondence relationship between the moiré fringe pattern in the moiré image and a crystal strain in the crystal region. An analysis unit is configured to compare the moiré fringe pattern in the moiré image to predetermined correspondence relationships stored in the second storage unit.

20 Claims, 6 Drawing Sheets

(51) Int. Cl.
  *H01L 21/66* (2006.01)
  *G06T 7/40* (2017.01)
  *H01L 29/16* (2006.01)
  *H01L 29/205* (2006.01)
  *H01L 29/20* (2006.01)

(52) U.S. Cl.
  CPC .... *H01L 22/12* (2013.01); *G06T 2207/10056* (2013.01); *G06T 2207/10061* (2013.01); *G06T 2207/30148* (2013.01); *H01L 29/16* (2013.01); *H01L 29/1608* (2013.01); *H01L 29/2003* (2013.01); *H01L 29/205* (2013.01)

(56) References Cited

U.S. PATENT DOCUMENTS

2010/0158392 A1* 6/2010 Adams ................. G01N 23/203
                                                                    382/218

2010/0252735 A1* 10/2010 Hytch ..................... H01J 37/26
                                                                    250/311

2016/0161249 A1   6/2016 Ri et al.

FOREIGN PATENT DOCUMENTS

JP      2016142726 A    8/2016
JP      6120459 B2      4/2017

OTHER PUBLICATIONS

Yoshiharu Morimoto, Grating Method for Examining the Shape and Deformation of a Structure Moire Method, No. 1 Measurement of Displacement Distribution and Strain Distribution by Sampling Moire Method, Shinkawa Times, vol. 7, Mar. 13, 2015, http://www.shinkawa.co.jp/times/column/y-morimoto/vol007_no05_col05.html (with machine translation).

* cited by examiner

- PREPARE SAMPLE FOR ANALYSIS — S101
- ACQUIRE TEM IMAGE — S102
- GENERATE MOIRE IMAGE — S103
- DETECT CRYSTAL DEFECT AND SPECIFY POSITION — S104
- CALCULATE DENSITY OF CRYSTAL DEFECT — S105
- IDENTIFY TYPE OF CRYSTAL DEFECT — S106
- COMPOSITE CRYSTAL DEFECT POSITION AND TEM IMAGE — S107
- DISPLAY RESULT OF ANALYSIS — S108

CRYSTAL ANALYSIS APPARATUS AND CRYSTAL ANALYSIS METHOD

CROSS-REFERENCE TO RELATED APPLICATION

This application is based upon and claims the benefit of priority from. Japanese Patent Application No. 2017-126112, filed Jun. 28, 2017, the entire contents of which are incorporated herein by reference.

FIELD

Embodiments described herein relate generally to a crystal analysis apparatus and a crystal analysis method.

BACKGROUND

A crystal defect or a crystal strain in a crystal of a semiconductor device can degrade the properties of the semiconductor device. Therefore, it is desirable that crystal defects and crystal strain is detected with high precision during or after the manufacturing of the semiconductor device.

DETAILED DESCRIPTION

Figure 1:
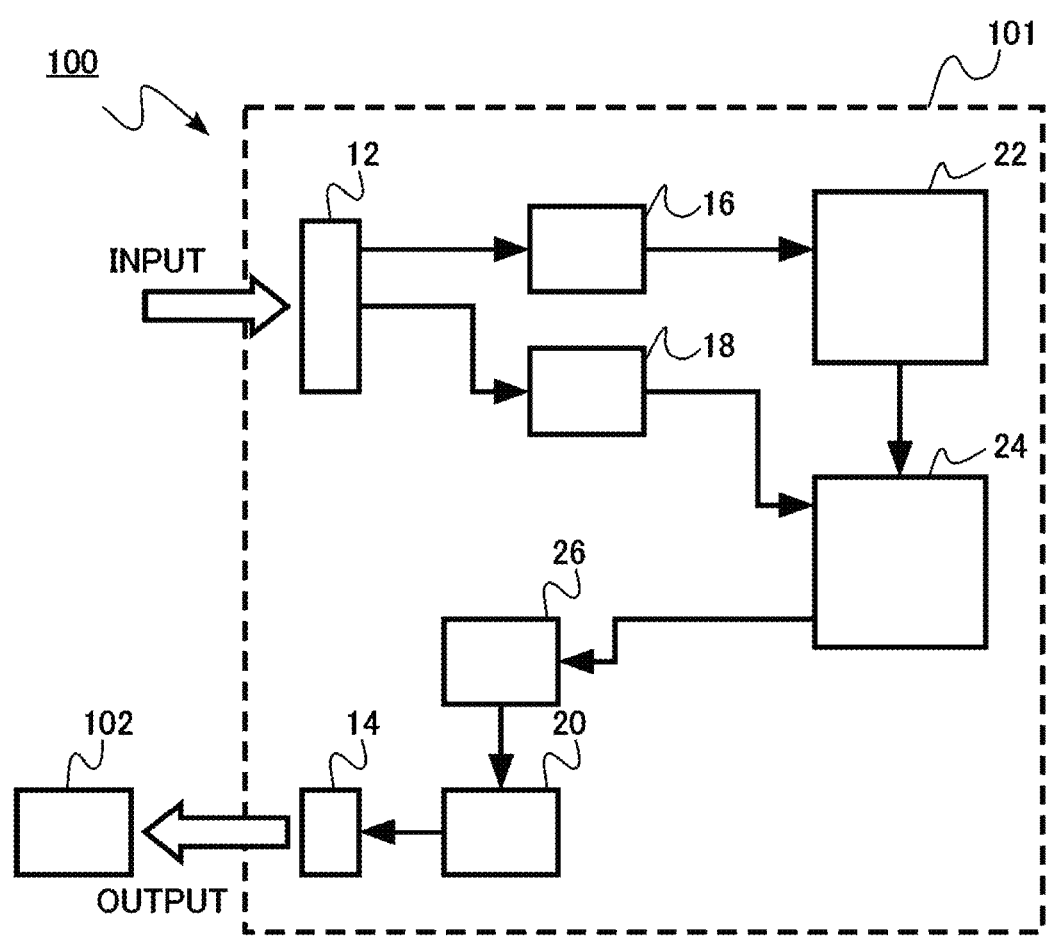
FIG. 1 is a block diagram of a crystal analysis apparatus according to a first embodiment.

In general, according to one embodiment, a crystal analysis apparatus includes a first storage unit storing a crystal lattice image of a crystal region of a sample and a reference crystal lattice image for the crystal region of the sample. A first image processing unit is configured to generate a moiré image from the crystal lattice image and the reference crystal lattice image. A second storage unit stores a predetermined correspondence relationship between a moiré fringe pattern in the moiré image and a crystal defect in the crystal region and/or a predetermined correspondence relationship between the moiré fringe pattern in the moiré image and a crystal strain in the crystal region. An analysis unit is configured to compare the moiré fringe pattern in the moiré image to predetermined correspondence relationships stored in the second storage unit.

In some cases, in the present specification, the same or substantially similar components are given the same reference numerals and repeated descriptions thereof may be omitted.

First Embodiment

A crystal analysis apparatus according to the present embodiment includes a first storage unit which can store a first image that includes a crystal lattice image of a crystal region, of a sample which includes the crystal region, a first image processing unit that generates a moiré image from the crystal lattice image, a second storage unit which can store at least one of a correspondence relationship between a moiré fringe pattern of the moiré image and a crystal defect, and a correspondence relationship between the pattern of the moiré fringe pattern of the moiré image and a crystal strain, and an analysis unit that analyzes the moiré image referring to the at least one correspondence relationship, and detects at least one of the crystal defect and the crystal strain in the crystal region.

FIG. 1 is a block diagram of the crystal analysis apparatus according to the present embodiment.

A crystal analysis apparatus 100 according to the present embodiment includes a computer 101 and a display 102 (a display unit). The computer 101 includes an input interface 12, an output interface 14, a sample image storage unit 16 (the first storage unit), a correspondence relationship storage unit 18 (the second storage unit), an analysis result record unit 20 (a third storage unit), a moiré image generation unit 22 (the first image processing unit), an analysis unit 24, and an image compositing unit 26 (a second image processing unit).

The crystal analysis apparatus 100 according to the present embodiment analyzes the crystal defect that is present in semiconductor crystal region of the semiconductor device. The semiconductor device is a sample for analysis. The semiconductor device, for example, is a device whose manufacturing is in progress, a device whose manufacturing has just been finished, or a device that is determined as being defective after being manufactured. The sample for analysis may be a crystal substrate for manufacturing the semiconductor device.

The crystal analysis apparatus 100, for example, analyzes the crystal defect using a cross-sectional transmission electron microscope (TEM) image of the semiconductor device.

The input interface 12 is an interface for inputting information into the computer 101 from the outside. The input interface 12, for example, may be a terminal to which a storage medium can be connected, be a terminal to which a cable for transferring information can be connected, or be a reception unit on a wireless LAN. The cross-sectional TEM image (the first image), including the crystal lattice image of the semiconductor crystal region, of the semiconductor device that includes the semiconductor crystal region is input from the input interface 12.

The sample image storage unit 16 has a function of storing the cross-sectional TEM image of the semiconductor device that includes the semiconductor crystal region. The sample image storage unit 16 has, for example, a semiconductor memory or a hard disk, as a storage device.

The moiré image generation unit 22 that has a function of generating the moiré image from the crystal lattice image of the cross-sectional TEM image converts the crystal lattice image of the cross-sectional TEM image, which is stored in the sample image storage unit 16 into the moiré image.

The moiré image generation unit 22, for example, is configured as hardware, software executed by a processor, or a combination of the hardware and the software executed by a processor. The moiré image generation unit 22, for example, is an electric circuit.

The correspondence relationship storage unit 18 has a function of storing a correspondence relationship between the pattern of the moiré fringe pattern and the crystal defect. The correspondence relationship between the moiré fringe pattern and the crystal defect results from acquiring, in advance, specific patterns in the moiré fringe pattern that occurs in a case where the crystal defect occurs and compiling these specific patterns into a database. The specific pattern(s) in the moiré fringe pattern that occurs in the case where the crystal defect occurs, for example, is a non-contiguous part. The correspondence relationship between the patterns of the moiré image and the crystal defect, for example, is input from the input interface 12 into the correspondence relationship storage unit 18.

A correspondence relationship between the pattern of the moiré fringes and a type of crystal defect may further be stored in the correspondence relationship storage unit 18. The type of crystal defect, for example, is a line defect such as dislocation, or a plane defect such as a stacking defect. The correspondence relationship storage unit 18 has, for example, a semiconductor memory or a hard disk, as a storage device.

The analysis unit 24 has a function of analyzing the moiré image by referring to the correspondence relationship between the patterns of the moiré fringes and the crystal defect, which is stored in the correspondence relationship storage unit 18, and detecting the crystal defect in the semiconductor crystal region. Furthermore, the analysis unit 24, for example, has a function of calculating the density of the crystal defect. Furthermore, the analysis unit 24, for example, has a function of identifying the type of crystal defect by referring to the correspondence relationship stored in the correspondence relationship storage unit 18.

The analysis unit 24, for example, is configured as hardware, software executed by a processor, or a combination of the hardware and the software executed by a processor. The analysis unit 24, for example, is an electric circuit in some embodiments.

The image compositing unit 26 has a function of generating a composite image (a second image) that results from compositing the result of the analysis that is obtained in the analysis unit 24 and the cross-sectional TEM image. The image compositing unit 26, for example, causes coordinates of the crystal defect, which is detected in the analysis unit 24, to be superimposed onto the cross-sectional TEM image.

The image compositing unit 26, for example, is configured as hardware, software executed by a processor, or a combination of the hardware and the software executed by a processor. The image compositing unit 26, for example, is an electric circuit.

The analysis result record unit 20 has a function of storing the result of the analysis that is obtained in the analysis unit 24. For example, the composite image, which is obtained in the image compositing unit 26, is stored in the analysis result record unit 20. The analysis result record unit 20 has, for example, a semiconductor memory or a hard disk, as a storage device. It is noted that each of the storage units 16, 18, and 20 described above may be individually provided, and two or more storage units 16, 18, or 20, or all the storage units 16, 18, and 20 may be configured as one storage unit.

The output interface 14 is an interface for outputting information from the computer 101 to the outside. The output interface 14, for example, may be a terminal to which a storage medium can be connected, be a terminal to which a cable for transferring information can be connected, or be a transmission unit on a wireless LAN.

For example, the result of the analysis of the semiconductor crystal region of the semiconductor device that is stored in the analysis result record unit 20 is output from the output interface 14 to the semiconductor device. The output interface 14 and the input interface 12 may be used in a shared manner.

The result of the analysis that is output from the output interface 14 is displayed on the display 102. Image data that is stored in the analysis result record unit 20, or a crystal defect distribution of the semiconductor crystal region is displayed on the display 102. For example, the composite image, which is obtained in the image compositing unit 26, can be displayed directly on the display 102.

Next, a crystal analysis method according to the present embodiment will be described. The crystal analysis method according to the present embodiment is performed using the crystal analysis apparatus 100.

In the crystal analysis method according to the present embodiment, the moiré image is generated from the crystal lattice image of the first mage that includes the crystal lattice image of the semiconductor crystal region, of the sample that includes the semiconductor crystal region, the moiré image is analyzed referring to the correspondence relationship between the pattern of the moiré fringes and the crystal defect, and the crystal defect in the semiconductor crystal region is thus detected.

Figure 2:
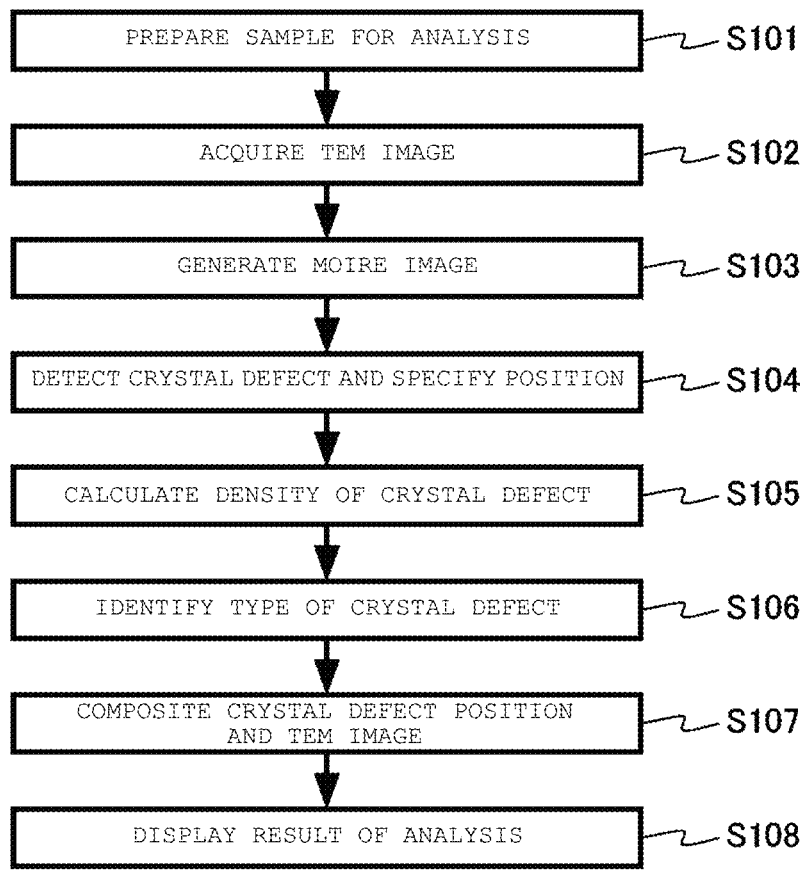
FIG. 2 is a diagram illustrating a process flow for a crystal analysis method according to the first embodiment.

FIG. 2 is a diagram illustrating a flow for the crystal analysis method according to the present embodiment.

First, a sample for analysis that includes the semiconductor crystal region is prepared (S101). The sample for analysis is, for example, a portion of the semiconductor device. The sample here is a thin film-stacked body (or a portion thereof) that includes two types of semiconductor crystal regions that are analysis targets.

Next, a TEM image that includes the crystal lattice image of the semiconductor crystal region is acquired (S102). The cross-sectional TEM image of the semiconductor device is captured with a transmission electron microscope (TEM).

Next, a moiré image is generated from the crystal lattice image of the semiconductor crystal region (S103). The moiré image is generated by the moiré image generation unit 22. For example, the crystal lattice image obtained by TEM and a reference mark pattern that has a periodicity that is the same as an expected periodicity of the crystal lattice image are digitally superimposed on each other, and thus the moiré image is generated from the crystal lattice image.

Next, the moiré image is analyzed referring to a previously stored correspondence relationship between the patterns of the moiré fringes in the moiré image and a crystal defect (or defects), and the crystal defect in the semiconductor crystal region is thereby detected (S104). The moiré image is analyzed by the analysis unit 24.

That is, a specific pattern of moiré fringes that is known to correspond to a crystal defect can be extracted from the moiré image obtained from the cross-sectional TEM image, and the crystal defect detected by pattern matching. The specific pattern of the moiré fringes that corresponds to a particular crystal defect type is stored in the correspondence relationship storage unit 18. The crystal defect can be detected by pattern matching a stored pattern relative the moiré image. For example, by comparing the stored pattern of the moiré fringes that corresponds to a crystal defect to the pattern of the moiré fringes generated by the sample, a similarity score or value can be determined. In a case where the similarity is high, it can be determined that the crystal defect is present in the sample.

Moreover, at this point, a coordinate position of the detected crystal defect may be specified as well.

Next, the defect density of the detected crystal defects is calculated (S105). The defect density is calculated by the analysis unit 24. The defect density, for example, may be calculated only for a particular region of the moiré image.

Next, the type of crystal defect may be identified by referring to the correspondence between the sample pattern of the moiré fringes and the type of crystal defect (S106). The type of crystal defect is identified by the analysis unit 24 by comparison to moiré fringe patterns stored in advance in the correspondence relationship storage unit 18 by defect type.

Next, the coordinate position of the detected crystal defect and the cross-sectional TEM image are composited and thus a composite image is generated (S107). The composite image is generated in the image compositing unit 26. In addition to the coordinates of the crystal defect, the type of crystal defect can also be indicated on the composite image.

Next, the result of the analysis of the moiré image is displayed on the display 102 (S108). For example, the composite image that is generated in the image compositing unit is displayed on the display 102. A structure of semiconductor device and the crystal defect distribution of the semiconductor device are displayed on the composite image. Furthermore, for example, the number of crystal defects or the density of the crystal defect for every type of crystal defect may be displayed as a table on the display 102.

The crystal defect in a semiconductor crystal of the semiconductor device degrades the performance properties of the semiconductor device. For this reason, it is desirable that crystal defects be detected with high precision. Furthermore, it is particularly desirable that crystal defects in a semiconductor substrate be detected with high precision before the manufacturing of the semiconductor device begins or is substantially completed.

Figure 3:
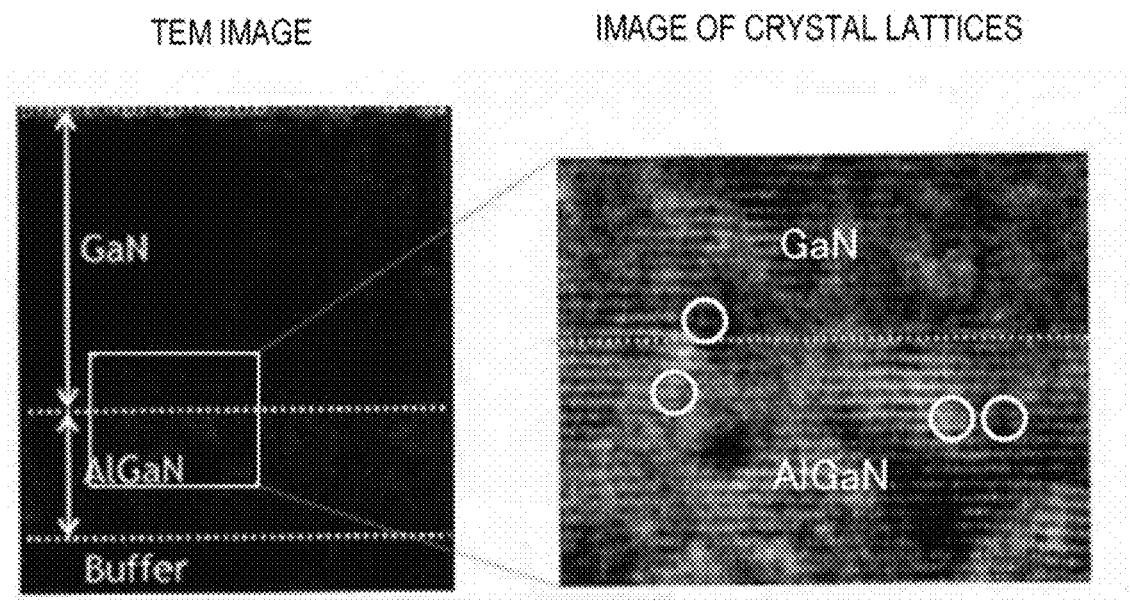
FIG. 3 is a diagram illustrating an example of a cross-sectional TEM image of a semiconductor device.

FIG. 3 is a diagram illustrating an example of the cross-sectional TEM image of a semiconductor device. The semiconductor device is a nitride semiconductor device that includes a crystalline region of nitride semiconductor. The right-hand side image in FIG. 3 results from enlarging the portion of the left-hand side image surrounded by the white frame.

The semiconductor device in FIG. 3, as illustrated in the left-hand image, has a layer-stacked structure of an aluminum gallium nitride (AlGaN) layer, a gallium nitride (GaN) layer, and a buffer layer on a substrate (substrate is not depicted). The aluminum gallium nitride layer and the gallium nitride each are monocrystalline semiconductor crystal regions.

As illustrated in the right-hand image in FIG. 3, in the cross-sectional TEM image, a crystal lattice image of the semiconductor crystal region in the vicinity of the boundary between the aluminum gallium nitride layer and the gallium nitride is shown. Various crystal defects can be visually detected in the crystal lattice image of the semiconductor crystal region. For example, an abnormal part of a crystal lattice is a part where the crystal lattice appears non-continuous. For example, parts that are surrounded by circles in the right-hand image appear to be crystal defects.

However, a contour of an atom is indefinite in the crystal lattice image, or there may be a part where the crystal lattice itself is difficult to see. For this reason, the crystal defect is difficult to detect with high precision by mere visual observation. Furthermore, it takes time to visually detect the crystal defects in this manner.

In the first embodiment, a moiré image is generated using the crystal lattice image. Then, the crystal defects are detected from the pattern of the moiré fringes in the moiré image. An abnormal part of the crystal lattice will, in general, be emphasized in the moiré image. Therefore, the crystal defects are easier to detect with high precision.

Figure 4:
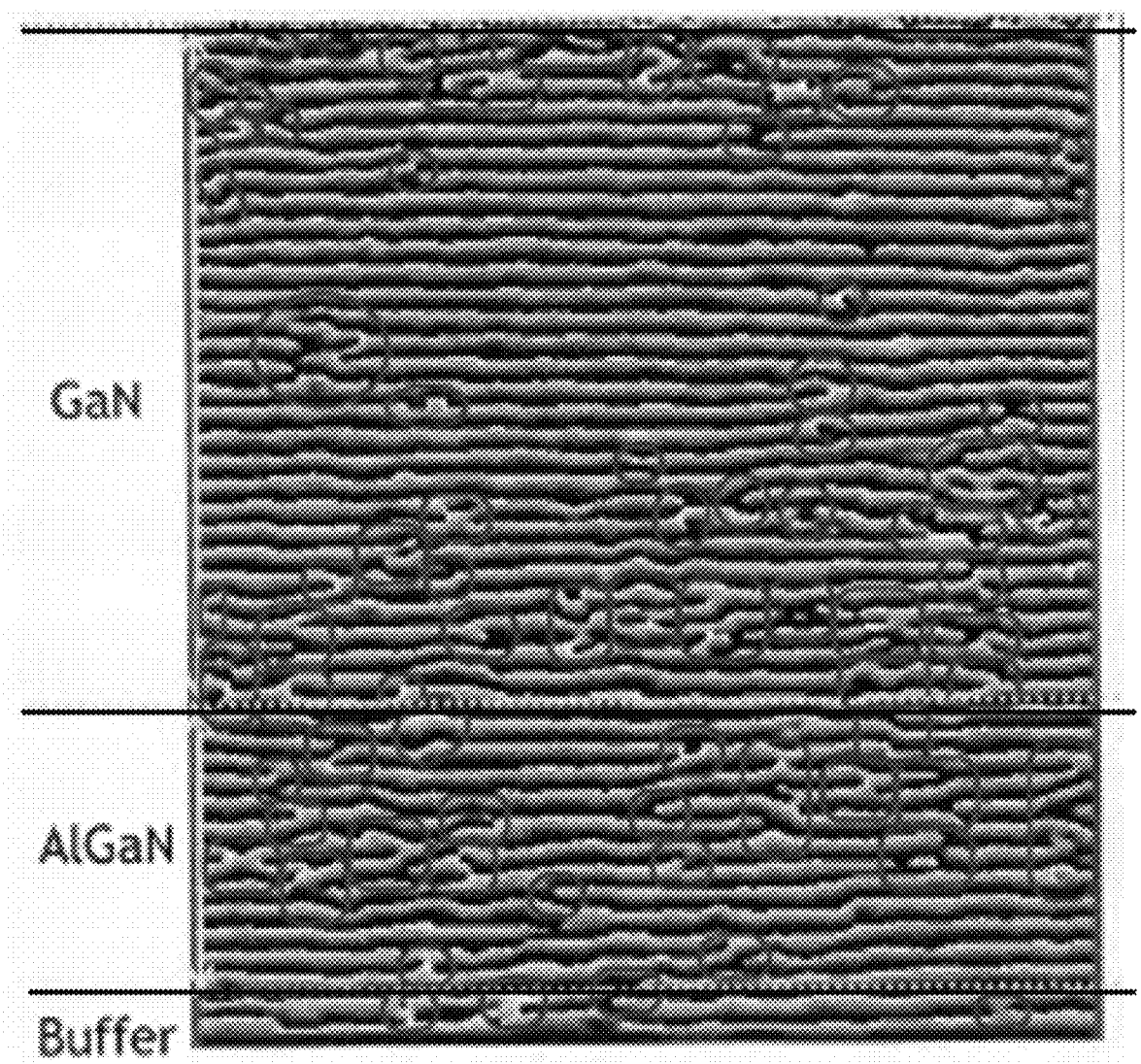
FIG. 4 is a diagram illustrating an example of a moiré image of a semiconductor device.

FIG. 4 is a diagram illustrating an example of a moiré image of a semiconductor device. FIG. 4 is a moiré image that has been generated using the crystal lattice image of the semiconductor crystal region of the cross-sectional TEM image in FIG. 3.

Portions of FIG. 4 that are surrounded by dark grey frames have crystal defects. As is apparent from FIG. 4, because the abnormal part of the crystal lattice in the moiré image is emphasized in the pattern of the moiré fringes, the crystal defects are easier to see.

Furthermore, in the first embodiment, a specific pattern of the moiré fringes that occurs when a crystal defect occurs can be acquired in advance to create a database of crystal defects. Then, by referring to this database, the crystal defects can automatically detected from the pattern of the moiré fringes. Therefore, the crystal defect can be detected in a shorter time.

Furthermore, if a specific pattern of the moiré fringe for every possible type of crystal defect is acquired in advance, then the particular type of crystal defects can be automatically identified.

Furthermore, in the first embodiment, the density of the crystal defects can also be calculated. In general, the quality of a semiconductor region of the semiconductor device is easier to identify by this process. The density of the crystal defects may also be calculated only for a desired sub-region of the moiré image. For example, an interfacial region and a bulk region of the crystal region can be isolated from each other when calculating the density of the crystal defects. This technique is useful for categorizing a mode of the crystal defect generation and thus determining the cause of the crystal defect(s).

Furthermore, for example, in some cases, the crystal defect may be caused by a structure that is formed as part of the semiconductor device or by a process condition that forms such a structure. The structures that tend to cause crystal defects include, for example, a trench that is formed in the semiconductor crystal region, an impurity region that is formed in the semiconductor crystal region, a gate electrode, and a contact hole, and the like.

In the first embodiment, the particular image coordinates of the detected crystal defect(s) and the cross-sectional TEM image can be composited to generate a composite image. Therefore, a relationship between a physical structure that is formed in the semiconductor device and the position of crystal defect(s) can be easily ascertained.

Furthermore, in the first embodiment, the result of the moiré image is displayed on the display 102. Since the result of the defect analysis can also displayed on the display 102, the result of the defect analysis is easily comprehended.

As described, with a crystal analysis apparatus and a crystal analysis method according to the first embodiment, the crystal defects in a semiconductor crystal can be detected with high precision. Furthermore, the crystal defects in the semiconductor crystal can be detected in a short time. Furthermore, the quality of a semiconductor region is easy to identify. Furthermore, the relationship between device structures that are formed in the semiconductor device and the crystal defects can be easily comprehended. Furthermore, the result of the analysis is easier to comprehend.

Second Embodiment

A crystal analysis apparatus and a crystal analysis method according to the second embodiment differ from those according to the first embodiment in that crystal strain is detected instead of a crystal defect. Details of the second embodiment that overlap those of the first embodiment may be omitted. A configuration of the crystal analysis apparatus according to the second embodiment can be substantially same as that according to the first embodiment.

The correspondence relationship storage unit 18 of the crystal analysis apparatus that is illustrated in FIG. 1 has a function of storing a predetermined correspondence relationship between a pattern of the moiré fringes and crystal strain. The correspondence relationship between the patterns of the moiré fringe and the crystal strain results from acquiring, in advance, specific patterns of the moiré fringes that occurs when a crystal strain occurs and then compiling these specific patterns into a database.

In a case where the crystal strain is not present in the semiconductor crystal region, the crystal lattice of the crystal lattice image has a parallel arrangement. On the other hand, in a case where the crystal strain is not present in the semiconductor crystal region, the crystal lattice has an inclined arrangement. Therefore, in the case where the crystal stain is present, the moiré fringe is inclined in the moiré image as well.

The specific pattern of the moiré fringe that occurs in the case where the crystal strain occurs, for example, is the moiré fringe that has an inclination that is equal to or larger than a predetermined magnitude.

A correspondence relationship between the pattern of the moiré fringe and an amount of strain in the crystal strain may further be stored in the correspondence relationship storage unit 18. The amount of strain in the crystal strain, for example, is a correlation with the magnitude of the inclination of the moiré fringe or an amount of change in the inclination.

The analysis unit 24 has a function of analyzing the moiré image referring to the correspondence relationship between the pattern of the moiré fringe and the crystal strain, which is stored in the correspondence relationship storage unit 18, and detecting the crystal strain in the semiconductor crystal region. Furthermore, the analysis unit 24, for example, has a function of calculating the density of the crystal strain. Furthermore, the analysis unit 24, for example, has a function of calculating the amount of strain in the crystal strain referring to the correspondence relationship between the pattern of the moiré fringe and the amount of strain in the crystal strain that is stored in the correspondence relationship storage unit 18.

The image compositing unit 26 has the function of generating the composite image (the second image) that results from compositing the result of the analysis that is obtained in the analysis unit 24 and the cross-sectional TEM image. The image compositing unit 26, for example, causes a coordinate position of the crystal strain, which is detected in the analysis unit 24, to be superimposed onto the cross-sectional TEM image.

The result of the analysis that is output from the output interface 14 is displayed on the display 102. For example, a crystal strain distribution of the semiconductor crystal region is displayed on the display 102. For example, the composite image, which is obtained in the image compositing unit 26, is displayed on the display 102.

In the crystal analysis method according to the present embodiment, the moiré image is generated from the crystal lattice image of the first image that includes the crystal lattice image of the crystal region, of the sample that includes the crystal region, the moiré image that is generated from the crystal lattice image is analyzed referring to at least one of the correspondence relationship between the pattern of the moiré fringe of the moiré image and the crystal defect and the correspondence relationship between the pattern of the moiré fringe of the moiré image and the crystal strain, and at least one of the crystal defect and the crystal strain in the crystal region is detected. The crystal analysis method according to the present embodiment is performed using the crystal analysis apparatus 100.

Figure 5:
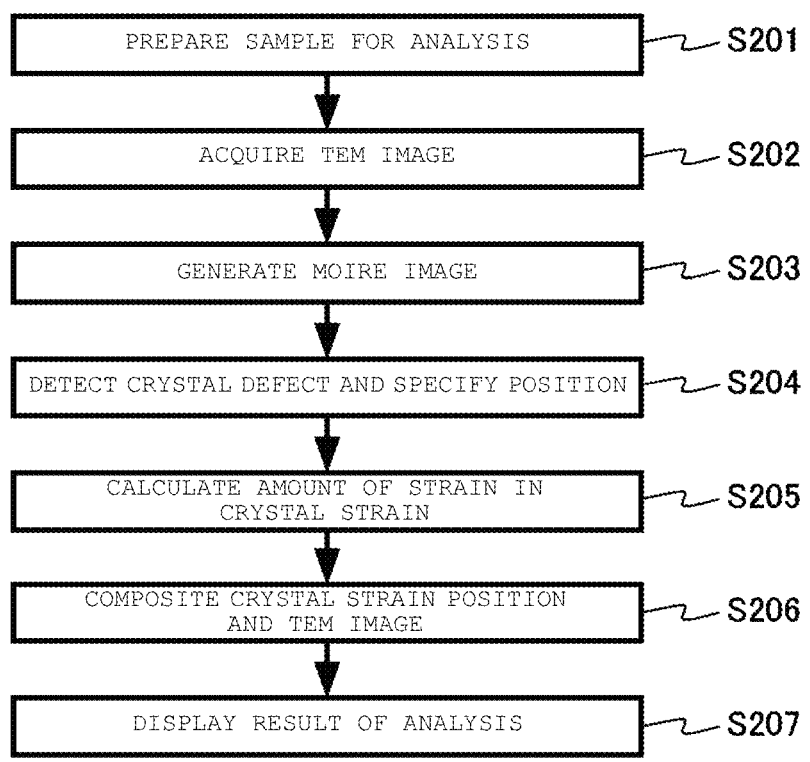
FIG. 5 is a diagram illustrating a process flow for a crystal analysis method according to a second embodiment.

FIG. 5 is a diagram illustrating a flow for the crystal analysis method according to the second embodiment.

First, the sample for analysis that includes the semiconductor crystal region is prepared (S201). The sample for analysis, for example, is the semiconductor device.

Next, the TEM image that includes the crystal lattice image of the semiconductor crystal region will be acquired (S202). For example, the cross-sectional TEM image of the semiconductor device is captured with the TEM.

Next, the moiré image will be generated from the crystal lattice image of the semiconductor crystal region (S203). The moiré image is generated by the moiré image generation unit 22.

Next, the moiré image will be analyzed referring to the correspondence relationship between the pattern of the moiré fringe and the crystal strain, and thus the crystal strain in the semiconductor crystal region will be detected (S204). The moiré image is analyzed by the analysis unit 24. A specific pattern of the moiré fringe that corresponds to the crystal strain is extracted from the moiré image that is obtained from the cross-sectional TEM image, and the crystal strain is detected. The specific pattern of the moiré fringe that corresponds to the crystal strain is stored in the correspondence relationship storage unit 18. Moreover, at this point, the coordinate position of the detected crystal strain is specified as well.

Next, the amount of strain in the detected crystal strain will be calculated (S205). The amount of strain in the crystal strain is calculated by the analysis unit 24.

Next, coordinates of the crystal strain and the cross-sectional TEM image are composited and thus the composite image will be generated (S206). The composite image is generated in the image compositing unit 26. In addition to the coordinates of the crystal strain, the amount of strain in the crystal strain can also be displayed on the composite image.

Next, the result of the analysis of the moiré image will be displayed on the display 102 (S207). For example, the composite image that is generated in the image compositing unit 26 is displayed on the display 102. The structure of and the crystal strain distribution of the semiconductor device are displayed on the composite image. Furthermore, for example, the number of parts where the crystal strain takes place or the amount of strain in the crystal strain may be displayed as a table on the display 102.

Operations and effects that result from using the crystal analysis apparatus and the crystal analysis method according to the present embodiment will be described below.

The crystal strain in the semiconductor crystal of the semiconductor device is a cause that accounts for the degradation of the properties of the semiconductor device. Furthermore, in order to improve the mobility of a carrier, in some cases, encouragingly, the crystal strain is introduced into the semiconductor crystal. For this reason, after the manufacturing of the semiconductor device is in progress or is finished, it is desirable that the crystal strain in the semiconductor crystal is detected with high precision.

The crystal strain can also be visually detected from the crystal lattice image of the semiconductor crystal region. For example, an inclined part of the crystal lattice that is present in the arrangement that the crystal lattice has is visually searched for and is identified as the crystal strain. However, a contour of an atom is indefinite in the crystal lattice image, or there is a part where the crystal lattice itself is difficult to see. For this reason, the crystal strain is difficult to detect with high precision. Furthermore, it takes time to visually detect the crystal strain.

In the present embodiment, the moiré image is generated from the crystal lattice image of the semiconductor crystal region. Then, the crystal strain is detected from the pattern of the moiré fringe of the moiré image. An inclined part of the crystal lattice is set to be the moiré image for emphasis. Therefore, the crystal strain is easy to detect with high precision.

Furthermore, in the present embodiment, specific patterns of the moiré fringe that occur in the case where the crystal strain occurs are acquired in advance to create a database. Then, referring to the database, the crystal strain is automatically detected from the pattern of the moiré fringe. Therefore, the crystal strain can be detected in a short time.

Furthermore, in the present embodiment, the amount of strain in the crystal strain can also be calculated. However, the quality of the semiconductor region of the semiconductor device is easy to identify.

For example, in some cases, the crystal strain is caused by a structure that is formed in the semiconductor device or a process that forms such a structure. Furthermore, in some cases, encouragingly, the structure that causes the crystal strain to occur is formed.

The structures that cause the crystal strain, or the structure that causes the crystal strain to occur include a trench that is formed in the semiconductor crystal region, an impurity region that is formed in the semiconductor crystal region, a gate electrode, and a contact hole, a stress liner film, and the like.

In the present embodiment, the coordinate position of the crystal strain and the cross-sectional TEM image are composited to generate the composite image. Therefore, a relationship between the structure that is formed in the semiconductor device and the crystal strain can be easily comprehended.

For example, in case where encouragingly, the crystal strain is introduced into the semiconductor crystal in order to improve the mobility of the carrier, it is possible to easily comprehend whether or not a crystal strain with a desired magnitude occurs in a desired place.

Furthermore, in the present embodiment, the result of the moiré image is displayed on the display 102. Since the result of the analysis is displayed on the display 102, the result of the analysis is easily comprehended.

As described above, the crystal analysis apparatus and the crystal analysis method according to the present embodiment, the crystal strain in the semiconductor crystal can be detected with high precision. Furthermore, the crystal strain in the semiconductor crystal can be detected in a short time. Furthermore, the relationship between the structure that is formed in the semiconductor device and the crystal strain can be easily comprehended. Furthermore, the quality of the semiconductor region is easy to identify. Furthermore, the result of the analysis is easy to comprehend.

Third Embodiment

The crystal analysis apparatus according to the present embodiment is different from that according to the first embodiment in that a fourth storage unit in which a determination reference that is based on at least any one of the crystal defect and the crystal strain is stored, and a determination unit that makes a determination of whether the sample is non-defective or defective, based on the result of the analysis and the determination reference are further included. Furthermore, the crystal analysis method according to the present embodiment is different from that according to the first embodiment in that the determination of whether the sample is non-defective or defective is made based on the determination reference that is based on the crystal defect. Details of the second embodiment that overlap those of the first embodiment will be described below in a manner that omits a portion thereof.

Figure 6:
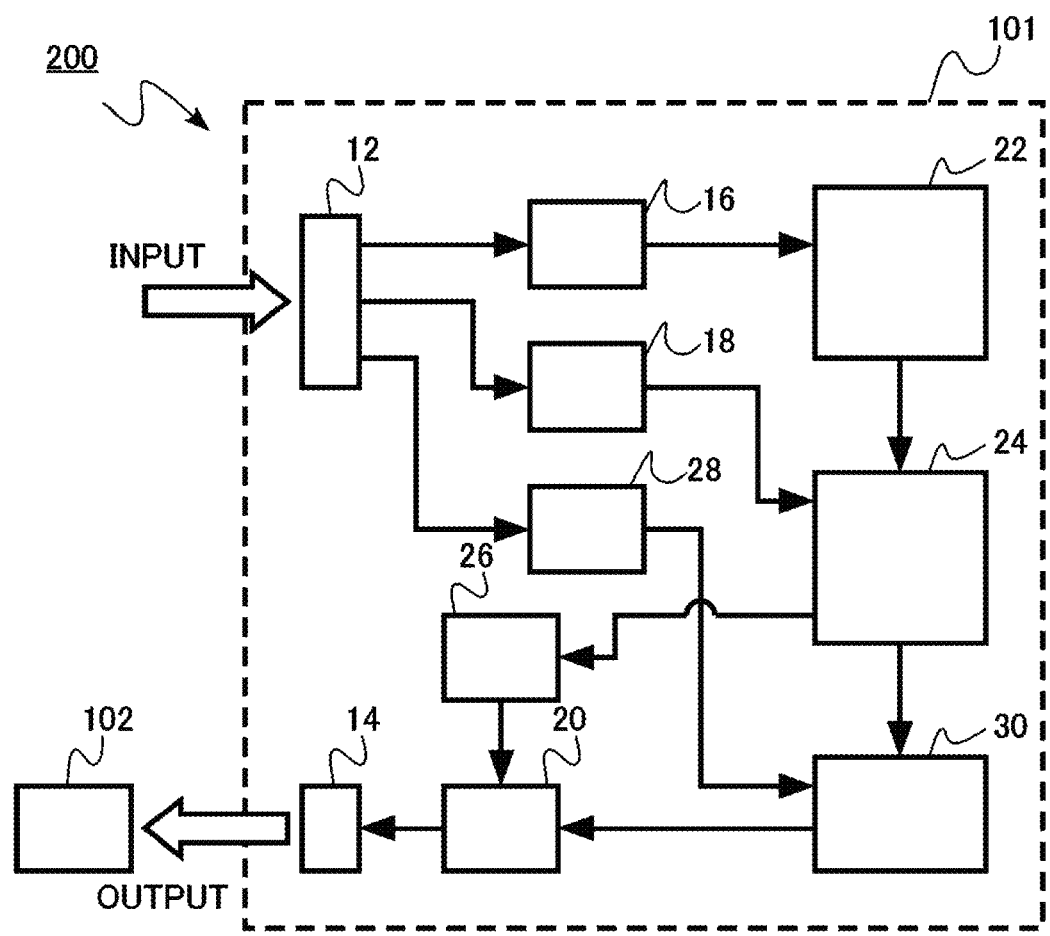
FIG. 6 is a block diagram of a crystal analysis apparatus according to a third embodiment.

FIG. 6 is a block diagram of the crystal analysis apparatus according to the present embodiment.

A crystal analysis apparatus 200 according to the present embodiment includes a computer 101 and a display 102 (a display unit). The computer 101 includes the input interface 12, the output interface 14, the sample image storage unit 16 (the first storage unit), the correspondence relationship storage unit 18 (the second storage unit), the analysis result record unit 20 (the third storage unit), the moiré image generation unit 22 (the first image processing unit), the analysis unit 24, the image compositing unit 26 (the second image processing unit), a determination reference storage unit 28 (the fourth storage unit), and a determination unit 30.

The determination reference storage unit 28 has a function of storing the determination reference that is based on the crystal defect. The determination reference, for example, is a threshold of the defect density. The determination reference storage unit 28 has, for example, a semiconductor memory or a hard disk, as a storage device. The determination reference, for example, is input from the input interface 12 into the correspondence relationship storage unit 18.

The determination unit 30 has a function of determining whether the semiconductor device is non-defective or defective, based on the result of the analysis and the determination reference that is stored in the determination reference storage unit 28. For example, in a case where the defect density as the result of the analysis exceeds the threshold of the defect density, it is determined that the semiconductor device is a defective product.

The determination unit 30, for example, is configured as hardware, software executed by a processor, or a combination of the hardware and the software executed by a processor. The determination unit 30, for example, is an electric circuit.

Figure 7:
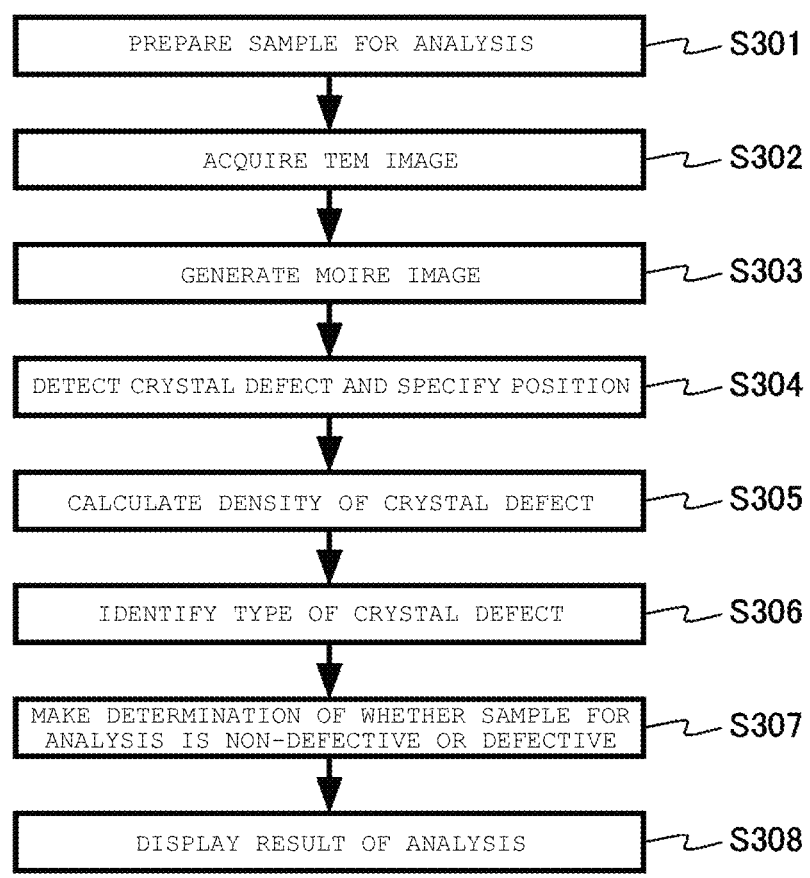
FIG. 7 is a diagram illustrating a process flow for a crystal analysis method according to the third embodiment.

FIG. 7 is a diagram illustrating a flow for the crystal analysis method according to the present embodiment.

First, the sample for analysis that includes the semiconductor crystal region is prepared (S301). The sample for analysis, for example, is a portion of the semiconductor device. The sample here is a sample of a thin film-stacked body that includes two types of semiconductor crystal regions that are analysis targets.

Next, the TEM image that includes the crystal lattice image of the semiconductor crystal region will be acquired (S302). For example, the cross-sectional TEM image of the semiconductor device is captured with the TEM.

Next, the moiré image will be generated from the crystal lattice image of the semiconductor crystal region (S303). The moiré image is generated by the moiré image generation unit 22. For example, the crystal lattice image and the mark pattern that has a periodicity which is the same as the periodicity of the lattice of the crystal lattice image are caused to be digitally superimposed on each other, and thus the moiré image is generated from the crystal lattice image.

Next, the moiré image will be analyzed referring to the correspondence relationship between the pattern of the moiré fringe and the crystal defect, and thus the crystal defect in the semiconductor crystal region will be detected (S304). Moreover, at this point, the coordinate position of the detected crystal defect is specified as well.

Next, the defect density of the detected crystal defect will be calculated (S305).

Next, referring to the correspondence relationship between the pattern of the moiré fringe and the type of crystal defect, the type of crystal defect will be identified (S306).

Next, the determination of whether the semiconductor device is non-defective or defective is made based on the determination reference that is based on the crystal defect (S307). For example, in the case where the defect density as the result of the analysis exceeds the threshold of the defect density, it is determined that the semiconductor device is a defective product.

Next, the determination result is displayed on the display 102 (S308). For example, information as to whether the semiconductor device is a non-defective product or a defective product is displayed on the display 102.

It is noted that it is also possible that, instead of the crystal defect, the crystal strain is detected and that the determination of whether the semiconductor device is non-defective and defective is made based on the determination reference that is based on the crystal strain.

With the crystal analysis apparatus and the crystal analysis method, it is possible that the determination of whether the semiconductor device is non-defective or defective based on the crystal defect or the crystal strain is rapidly made with high precision. With the crystal analysis apparatus and the crystal analysis method according to the present embodiment, for example, the manufacturing of the semiconductor device with a high yield is possible by using a production management of the semiconductor device. Furthermore, for example, an optimal process of manufacturing the semiconductor device is easy to develop by using the crystal analysis apparatus and the crystal analysis method for development of a process for the semiconductor device.

Fourth Embodiment

A crystal analysis apparatus and a crystal analysis method according to the present embodiment is different from that according to the first or second embodiment in that instead of the semiconductor crystal region of the semiconductor device, the crystal defect or the crystal strain of the crystal region of an interconnection within the semiconductor device is analyzed. Details of the fourth embodiment that overlap those of the first or second embodiment will be described below in a manner that omits a portion thereof.

The crystal analysis apparatus according to the present embodiment analyzes the crystal defect or the crystal strain that is present in a crystal region of the interconnection wiring within a semiconductor device. The metal interconnections, for example, include an aluminum interconnection, an aluminum alloy interconnection, or a copper interconnection. The metal interconnection can be a polycrystal (polycrystalline material). The crystal analysis apparatus according to the fourth embodiment may be used, for example, for narrowing-down to an individual crystal grain for analysis. An analysis method is generally otherwise the same as that according to the first or second embodiments.

As causes for poor reliability of the metal interconnection, electro migration (EM) and stress migration (SM) phenomenon are known. Electro migration and stress migration faults occur due to displacement of atoms in the metal connection. Furthermore, in a copper interconnect, it is known that tensile stress particularly facilitates corrosion of the interconnection.

According to the fourth embodiment, a crystal defect or a crystal strain of the metal interconnection can be detected and thus, for example, the analysis for determination of defect or the elucidation of a defect mechanism is facilitated. Furthermore, for example, it is possible to predict corrosion of a copper interconnection and thus optimize the design of the metal interconnection.

In the first to fourth embodiments, as an example, a case where the sample is the semiconductor device has been described, but any sample that includes a crystal region, for example, a monocrystal semiconductor material may be evaluated in the described manners.

In the first to third embodiments, a case in which the semiconductor crystal region is a nitride semiconductor has been described, but the semiconductor crystal region can also be made from another semiconductor material, such as silicon, or silicon carbide, and the embodiments are not limited to nitride semiconductor materials.

In the first to third embodiments, only one of a crystal defect and a crystal strain is detected at a time, but a crystal analysis apparatus and a crystal analysis method that detects both of the crystal defect and the crystal strain at the same time can be provided in other embodiments.

For example, a system in which the result of the analysis of the crystal defect (or the crystal strain) is used as feedback for adjusting a process condition of a semiconductor manufacturing apparatus. For example, it is typically assumed the crystal defect occurs frequently in the vicinity of a trench that is formed in the semiconductor device. A system can be established in which the result of the analysis is fed back to a recipe for operating an etching apparatus for forming trenches in the semiconductor device manufacturing process and thus an etching condition (or conditions) can be adjusted to reduce damage according to fed back analysis results.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A crystal analysis apparatus, comprising:
   a first storage unit storing a crystal lattice image of a crystal region of a sample and a pre-stored reference crystal lattice image for the crystal region of the sample;
   a first image processing unit configured to generate a moiré image by digitally superimposing the crystal lattice image and the pre-stored reference crystal lattice image;
   a second storage unit storing a predetermined correspondence relationship between a moiré fringe pattern in the moiré image and a crystal defect in the crystal region or a predetermined correspondence relationship between the moiré fringe pattern in the moiré image and a crystal strain in the crystal region; and an analysis unit configured to compare the moiré fringe pattern in the moiré image to predetermined correspondence relationships stored in the second storage unit.

2. The crystal analysis apparatus according to claim 1, further comprising:
a third storage unit to store an output result from the analysis unit indicating a comparison result between the moiré fringe pattern and at least one predetermined correspondence relationship stored in the second storage unit.

3. The crystal analysis apparatus according to claim 1, wherein the analysis unit is further configured to calculate a density of crystal defects in the crystal region of the sample according a total number of crystal defects detected in the crystal region by comparison of the moiré fringe pattern in the moiré image to predetermined correspondence relationships stored in the second storage unit.

4. The crystal analysis apparatus according to claim 1, wherein
predetermined correspondence relationships between the moiré fringe pattern of the moiré image are stored in the second storage unit according to crystal defect type, and
the analysis unit is configured to identify crystal defect type by referring to the predetermined correspondence relationships.

5. The crystal analysis apparatus according to claim 1, wherein the analysis unit calculates an amount of strain in the crystal region by referring to the predetermined correspondence relationships.

6. The crystal analysis apparatus according to claim 1, further comprising:
a display unit connected to the analysis unit and configured to display an output from the analysis unit.

7. The crystal analysis apparatus according to claim 1, further comprising:
a second image processing unit configured to composite the first image and an output from the analysis unit for simultaneous display.

8. The crystal analysis apparatus according to claim 1, further comprising:
a defect determination unit configured to indicate whether the sample is non-defective or defective based on an output from the analysis unit.

9. The crystal analysis apparatus according claim 1, wherein the sample is a portion of a semiconductor device.

10. The crystal analysis apparatus according to claim 1, wherein the crystal region comprises one of a nitride semiconductor, a silicon carbide, or a silicon material.

11. A crystal analysis method, comprising:
obtaining a crystal lattice image of a crystal region of a sample;
in a first image processing unit, generating a moiré image by digitally superimposing a pre-stored reference crystal lattice image and the crystal lattice image;
in an image analysis unit, comparing moiré fringe patterns in the moiré image to a library of pre-stored patterns having a predetermined correspondence to crystal defects or crystal strain; and
detecting a crystal defect or crystal strain in the crystal region according to a similarity, calculated by the image analysis unit, between the moiré fringe patterns of the moiré image and at least one pre-stored pattern of the library.

12. The crystal analysis method according to claim 11, further comprising:
calculating a density of crystal defects in the crystal region according to a detected number of crystal defects in the crystal region.

13. The crystal analysis method according to claim 11, further comprising:
identifying at least one detected crystal defect by type according to the similarity between the moiré fringe patterns of the moiré image and at least one pre-stored pattern of the library.

14. The crystal analysis method according to claim 11, further comprising:
calculating a total strain level in the crystal region according to the similarity between the moiré fringe patterns of the moiré image and at least one pre-stored pattern of the library.

15. The crystal analysis method according to claim 11, wherein the crystal lattice image is obtained with transmission electron microscopy.

16. The crystal analysis method according to claim 11, further comprising:
in a second image processing unit, generating a composite image including the crystal lattice image and a detected position of at least one crystal defect in the crystal region.

17. The crystal analysis method according to claim 11, further comprising: identifying a position of at least one crystal defect in the crystal region according to the moiré fringe patterns in the moiré image.

18. The crystal analysis method according to claim 11, wherein the sample is a portion of a semiconductor device.

19. The crystal analysis method according to claim 11, wherein the pre-stored reference crystal lattice image is a pattern image having a periodicity matching an expected periodicity of a crystal lattice depicted in the crystal lattice image.

20. The crystal analysis method according to claim 11, wherein crystal strain is detected.

* * * * *